United States Patent
Kim et al.

(10) Patent No.: US 11,038,128 B2
(45) Date of Patent: Jun. 15, 2021

(54) FLEXIBLE SUBSTRATE AND DISPLAY DEVICE INCLUDING THE SAME

(71) Applicant: Samsung Display Co., Ltd., Yongin-si (KR)

(72) Inventors: Won Ho Kim, Yongin-si (KR); Min Ju Kim, Yongin-si (KR); Sang Hun Oh, Yongin-si (KR); Keun Soo Lee, Yongin-si (KR); Jeong Ho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 181 days.

(21) Appl. No.: 15/990,041

(22) Filed: May 25, 2018

(65) Prior Publication Data

US 2019/0181361 A1   Jun. 13, 2019

(30) Foreign Application Priority Data

Dec. 12, 2017   (KR) ........................ 10-2017-0170587

(51) Int. Cl.
| | | |
|---|---|---|
| *H01L 51/00* | (2006.01) | |
| *H01L 27/32* | (2006.01) | |
| *G09G 3/3233* | (2016.01) | |
| *G09G 3/3275* | (2016.01) | |
| *H01L 51/52* | (2006.01) | |

(Continued)

(52) U.S. Cl.
CPC ....... *H01L 51/0097* (2013.01); *G09G 3/3233* (2013.01); *G09G 3/3275* (2013.01); *H01L 27/3262* (2013.01); *H01L 27/3276* (2013.01); *H01L 51/5206* (2013.01); *G09G 3/3266* (2013.01); *G09G 3/3291* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2380/02* (2013.01); *H01L 2251/5338* (2013.01)

(58) Field of Classification Search
CPC ............. H01L 27/3262; H01L 27/3276; H01L 27/3244; H01L 51/0097; H01L 2251/5338; H01L 51/52; G09G 3/3233; G09G 2380/02; G09F 9/301
See application file for complete search history.

(56) References Cited

U.S. PATENT DOCUMENTS

| | | |
|---|---|---|
| 8,629,450 B2 | 1/2014 | Kim et al. |
| 9,099,685 B2 | 8/2015 | Kim et al. |
| 9,461,256 B2 | 10/2016 | Lee et al. |

(Continued)

FOREIGN PATENT DOCUMENTS

| | | |
|---|---|---|
| KR | 10-0611226 B1 | 8/2006 |
| KR | 10-2013-0024093 A | 3/2013 |

(Continued)

*Primary Examiner* — Bac H Au
(74) *Attorney, Agent, or Firm* — Lewis Roca Rothgerber Christie LLP

(57) ABSTRACT

A flexible organic light-emitting display device may include: a first polymer layer; a first transparent conductive layer over the first polymer layer; a first inorganic layer over the first transparent conductive layer; and a plurality of pixels on the first inorganic layer and each including an organic light-emitting diode, and a driver configured to drive the organic light-emitting diode.

16 Claims, 7 Drawing Sheets

(51) Int. Cl.
*G09G 3/3266* (2016.01)
*G09G 3/3291* (2016.01)

(56) References Cited

U.S. PATENT DOCUMENTS

| | | | |
|---|---|---|---|
| 9,508,961 B2* | 11/2016 | Hirakata | H01L 51/56 |
| 9,697,764 B2* | 7/2017 | Kim | G06F 1/1652 |
| 9,985,236 B2* | 5/2018 | Kim | H01L 51/52 |
| 10,135,014 B2* | 11/2018 | Nishinohara | H01J 37/32018 |
| 10,236,471 B2* | 3/2019 | Oh | H01L 25/18 |
| 10,243,024 B2* | 3/2019 | Jin | H01L 27/3223 |
| 10,361,395 B2* | 7/2019 | Kajiyama | H01L 27/3276 |
| 10,381,425 B2* | 8/2019 | Kang | H01L 27/3248 |
| 10,401,991 B2* | 9/2019 | Son | H01L 51/52 |
| 10,424,631 B2* | 9/2019 | Kim | H01L 51/52 |
| 10,541,293 B2* | 1/2020 | Kim | H01L 27/3276 |
| 2002/0022156 A1* | 2/2002 | Bright | C23C 16/0272 428/698 |
| 2005/0122042 A1 | 6/2005 | Kang et al. | |
| 2017/0062541 A1* | 3/2017 | Ishiyama | H01L 27/3272 |
| 2017/0125505 A1* | 5/2017 | Oh | H01L 51/52 |
| 2017/0170206 A1* | 6/2017 | Lee | H01L 51/52 |
| 2017/0256594 A1* | 9/2017 | Bae | H01L 27/323 |
| 2017/0256599 A1* | 9/2017 | Kim | G09G 3/3291 |
| 2017/0358641 A1* | 12/2017 | Park | H01L 27/3276 |
| 2018/0033847 A1* | 2/2018 | Kim | H01L 27/1255 |
| 2018/0151845 A1* | 5/2018 | Jeong | H01L 27/323 |
| 2019/0088908 A1* | 3/2019 | Lin | H01L 29/78603 |
| 2019/0140202 A1* | 5/2019 | Jin | H01L 27/3276 |
| 2019/0334105 A1* | 10/2019 | Choi | H01L 51/5256 |

FOREIGN PATENT DOCUMENTS

| | | |
|---|---|---|
| KR | 10-2013-0100941 A | 9/2013 |
| KR | 10-2016-0081389 A | 7/2016 |
| KR | 10-2016-0082885 A | 7/2016 |

* cited by examiner

FLEXIBLE SUBSTRATE AND DISPLAY DEVICE INCLUDING THE SAME

CROSS-REFERENCE TO RELATED APPLICATION

This application claims priority to and the benefit of Korean patent application number 10-2017-0170587, filed on Dec. 12, 2017 in the Korean Intellectual Property Office, the entire disclosure of which is incorporated herein by reference.

BACKGROUND

1. Field

Aspects of embodiments of the present disclosure relate to a flexible substrate and a display device including the flexible substrate.

2. Description of the Related Art

A display device is a device which displays an image. Recently, an organic light-emitting diode display is in the spotlight as a display device.

The organic light-emitting diode display has spontaneous emission characteristics without needing a separate light source, so that it may have reduced thickness and weight. In addition, the organic light-emitting diode display has high-quality characteristics, such as low power consumption, high luminance, and high response speed.

Recently, a technique by which a substrate is manufactured as a flexible substrate so that an organic light-emitting diode display may be embodied as a flexible display device was proposed.

If the flexible substrate is defective, moisture may permeate an organic light-emitting diode through a defective portion of the flexible substrate, whereby the life span of the organic light-emitting diode display may be reduced. Furthermore, the luminance of an image may deteriorate depending on the characteristics of the flexible substrate.

SUMMARY

According to an aspect of embodiments of the present disclosure, a display device has a substrate with improved characteristics to prevent or substantially prevent deterioration in driving characteristics of a display panel.

According to one or more embodiments of the present disclosure, a flexible organic light-emitting display device includes: a first polymer layer; a first transparent conductive layer over the first polymer layer; a first inorganic layer over the first transparent conductive layer; and a plurality of pixels on the first inorganic layer and each including an organic light-emitting diode, and a driver configured to drive the organic light-emitting diode.

In an embodiment, the flexible organic light-emitting display device may further include: a second polymer layer; and a second inorganic layer between the second polymer layer and the first polymer layer.

In an embodiment, the flexible organic light-emitting display device may further include a buffer layer over the first inorganic layer.

In an embodiment, the first inorganic layer may include a first opening. The flexible organic light-emitting display device may further include a conductive connection pattern in the first opening and contacting the first transparent conductive layer.

In an embodiment, the flexible organic light-emitting display device may include: a first planar area in which the plurality of pixels is arranged; a first bending area on a side of the first planar area and configured to be bendable about a first bending axis extending in a first direction; and a second planar area on a side of the first bending area.

In an embodiment, the conductive connection pattern may be in the first planar area.

In an embodiment, the conductive connection pattern may be electrically coupled with a power supply unit provided in the second planar area.

In an embodiment, the first transparent conductive layer may be supplied with a ground voltage through the conductive connection pattern.

In an embodiment, the flexible organic light-emitting display device may further include: a second transparent conductive layer over the first inorganic layer; and a third inorganic layer over the second transparent conductive layer.

In an embodiment, the flexible organic light-emitting display device may further include a second transparent conductive layer under the second polymer layer.

In an embodiment, the first transparent conductive layer may include at least one second opening.

In an embodiment, the driver included in each of the plurality of pixels may include a plurality of thin-film transistors and a storage capacitor. The thin-film transistors may include: a first transistor including a gate electrode, a first electrode, and a second electrode, and configured to control current to be supplied from a first power source coupled with the first electrode to a second power source via the organic light-emitting diode, in response to a voltage of a first node coupled to the gate electrode; a second transistor coupled between a data line and the first transistor, and including a gate electrode coupled to a scan line; and a third transistor including a first electrode coupled to the first node, a second electrode coupled to the second electrode of the first transistor, and a gate electrode coupled to the scan line.

In an embodiment, the third transistor and the first transparent conductive layer may overlap with each other in a plan view.

According to one or more embodiments of the present disclosure, a flexible substrate includes: a first polymer layer; a first inorganic layer over the first polymer layer; a second polymer layer over the first inorganic layer; a first transparent conductive layer over the second polymer layer; and a second inorganic layer over the first transparent conductive layer.

In an embodiment, the flexible substrate may include: a first planar area; a first bending area on a side of the first planar area and configured to be bendable about a first bending axis extending in a first direction; and a second planar area on a side of the first bending area.

In an embodiment, the second inorganic layer may include a first opening. The flexible substrate may further include a conductive connection pattern in the first opening and contacting the first transparent conductive layer.

In an embodiment, the conductive connection pattern may be in the first planar area.

In an embodiment, the flexible substrate may further include: a second transparent conductive layer over the second inorganic layer; and a third inorganic layer over the second transparent conductive layer.

In an embodiment, the conductive connection pattern may pass through the second transparent conductive layer and the third inorganic layer.

In an embodiment, the flexible substrate may further include a second transparent conductive layer under the first polymer layer.

In an embodiment, the first transparent conductive layer may include at least one second opening.

In an embodiment, each of the first polymer layer and the second polymer layer may include polyimide.

DETAILED DESCRIPTION

Figure 1:
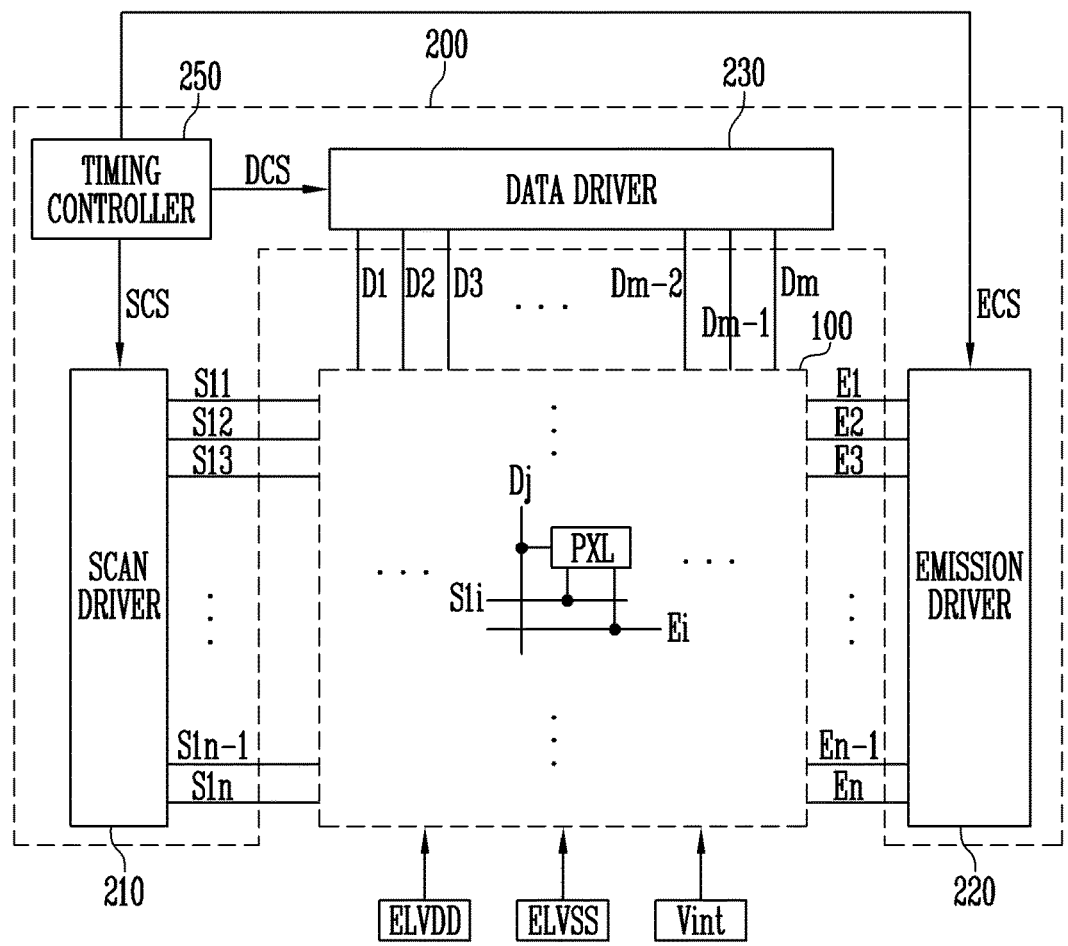
FIG. 1 illustrates a configuration of a display device in accordance with an embodiment of the present disclosure.

Herein, some embodiments will be described in greater detail with reference to the accompanying drawings. Some embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but do not limit the various components. These terms are used for the purpose of differentiating a component from other components. For example, a "first" component may be referred to as a "second" component, and a "second" component may be referred to as a "first" component, and so forth, without departing from the spirit and scope of the present disclosure. Furthermore, "and/or" may include any one of or a combination of the components mentioned.

Furthermore, a singular form may include a plural form as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through one or more intermediate components. On the other hand, "directly connected/directly coupled" refers to one component directly coupling another component without an intermediate component.

Herein, a substrate and a display device including the substrate in accordance with embodiments of the present disclosure will be described with reference to the accompanying drawings pertaining to the embodiments.

FIG. 1 illustrates a configuration of a display device in accordance with an embodiment of the present disclosure.

Referring to FIG. 1, the display device in accordance with an embodiment of the present disclosure may include a pixel unit 100 and a display driver 200. The display driver 200 may include a scan driver 210, an emission driver 220, a data driver 230, and a timing controller 250.

The timing controller 250 may generate a scan driving control signal SCS, a data driving control signal DCS, and an emission driving control signal ECS, based on signals input from an external device.

The scan driving control signal SCS generated from the timing controller 250 may be supplied to the scan driver 210. The data driving control signal DCS may be supplied to the data driver 230. The emission driving control signal ECS may be supplied to the emission driver 220.

The scan driver 210 may supply scan signals to scan lines S11 to S1n in response to the scan driving control signal SCS. For example, the scan driver 210 may successively supply the scan signals to the scan lines S11 to S1n.

The data driver 230 may supply data signals to data lines D1 to Dm in response to the data driving control signal DCS. The data signals supplied to the data lines D1 to Dm may be supplied to pixels PXL selected by the scan signals.

The emission driver 220 may supply emission control signals to emission control lines E1 to En in response to the emission driving control signal ECS. For example, the emission driver 220 may successively supply the emission control signals to the emission control lines E1 to En.

Although the scan driver 210 and the emission driver 220 have been illustrated in FIG. 1 as being separate components, the present disclosure is not limited thereto. For example, the scan driver 210 and the emission driver 220 may be formed as a single driver.

In an embodiment, the scan driver 210 and/or the emission driver 220 may be mounted on a substrate through a thin film process. Furthermore, the scan driver 210 and/or the emission driver 220 may be disposed on each of the opposite sides of the pixel unit 100.

The pixel unit 100 may include a plurality of pixels PXL that are coupled with the data lines D1 to Dm, the scan lines S11 to S1n, and the emission control lines E1 to En. The pixel unit 100 may correspond to a display area DA of the display device.

The pixels PXL may be supplied with a first power source ELVDD and a second power source ELVSS from an external device. In some cases, the pixels PXL may be supplied with an initialization power source Vint.

Each of the pixels PXL may be selected when a scan signal is supplied to a corresponding one of the scan lines S11 to S1n that is coupled with the pixel PXL, and then be supplied with a data signal from a corresponding one of the data lines D1 to Dm. The pixel PXL supplied with the data signal may control, in response to the data signal, current flowing from the first power source ELVDD to the second power source ELVSS via an emission element (not shown).

The emission element may generate light having a luminance (e.g., a predetermined luminance) in response to the current. In addition, the voltage of the first power source ELVDD may be set to a value higher than that of the second power source ELVSS.

Although each pixel PXL is illustrated in FIG. 1 as being coupled to a single scan line S1$i$, a single data line Dj, and a single emission control line Ei, the present disclosure is not limited thereto. In other words, depending on a circuit structure of each pixel PXL, a plurality of the scan lines S11 to S1n may be coupled to the pixel PXL, and a plurality of the emission control lines E1 to En may be coupled to the pixel PXL.

Figure 2:
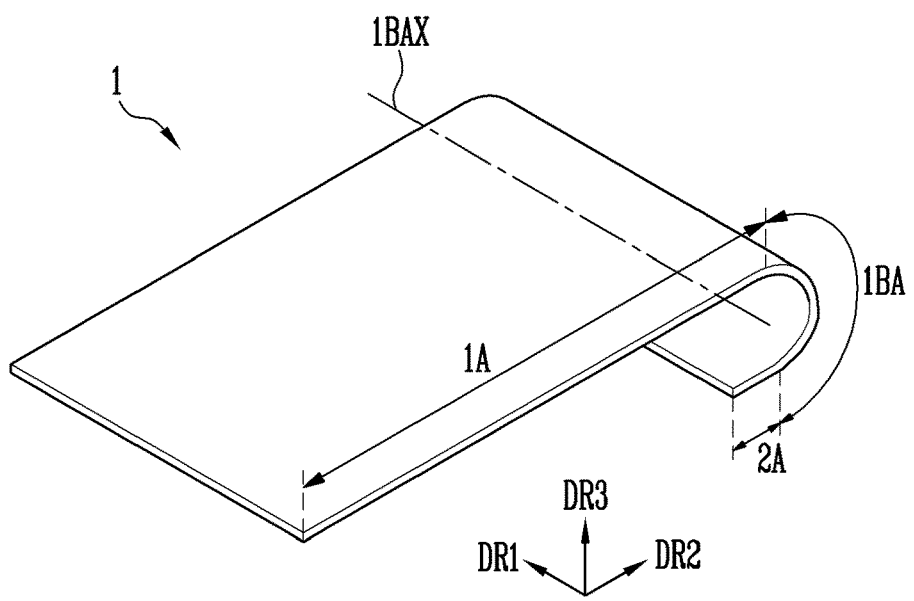
FIGS. 2 and 3 are diagrams illustrating a substrate in accordance with an embodiment of the present disclosure.
Figure 3:
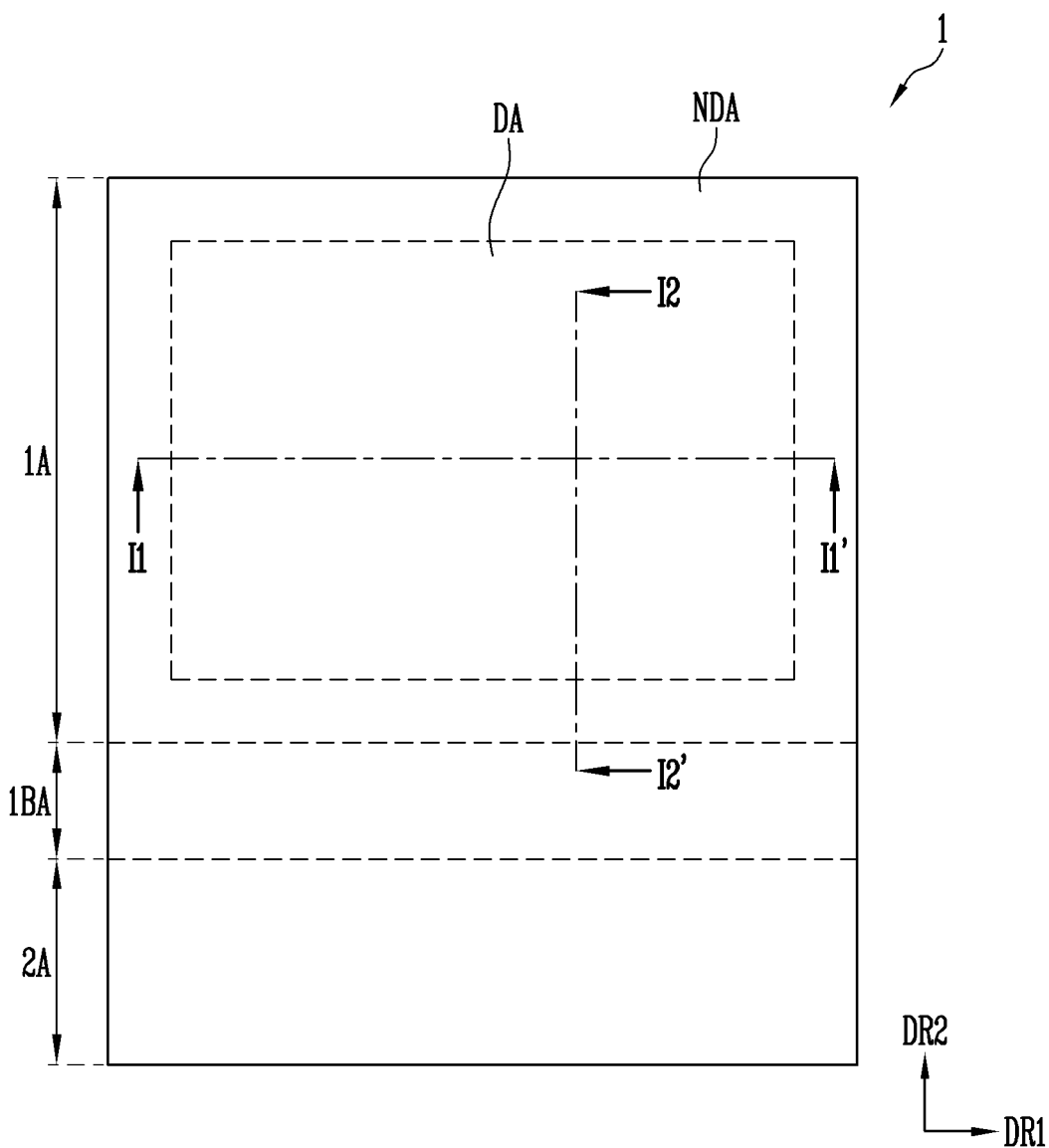

FIGS. 2 and 3 are diagrams illustrating a substrate 1 in accordance with an embodiment of the present disclosure.

For the sake of explanation, in FIG. 3, the substrate 1 is illustrated in an unbent state. Furthermore, in the cross-sectional views or plan views pertaining to the following embodiments, for the sake of explanation, the display device may also be illustrated in an unbent state.

As shown in FIG. 2, the substrate 1 provided to form the display device may have a partially bent shape.

Referring to FIG. 2, in an embodiment, the substrate 1 may include a first planar area 1A, a first bending area 1BA, and a second planar area 2A.

The first bending area 1BA may be disposed between the first planar area 1A and the second planar area 2A, based on a second direction DR2.

The first bending area 1BA may be formed by bending the substrate 1 about a first bending axis 1BAX extending in a first direction DR1, as shown in FIG. 2.

The substrate 1 may include any of various materials having flexible or bendable characteristics and, for example, may include a polymer resin, such as polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The first planar area 1A of the substrate 1 may include a display area DA which embodies an image to be recognized by a user, and a peripheral area NDA formed around the periphery of the display area DA. Here, the display area DA may correspond to the pixel unit 100 shown in FIG. 1, and components of the pixel unit 100 may be disposed on the display area DA of the substrate 1. Although not shown, a buffer layer may be disposed between the components of the pixel unit 100 and the substrate 1. The buffer layer may serve to increase a flatness of an upper surface of the substrate 1, and may serve to prevent or minimize impurities in the substrate 1, and the like from permeating into the components of the pixel unit 100.

In an embodiment, the display area DA may be provided neither in the first bending area 1BA nor in the second planar area 2A, and only the peripheral area NDA may be included in the first bending area 1BA and the second planar area 2A.

Although not shown, a power supply unit may be disposed in the second planar area 2A. The power supply unit may be separately formed and then coupled to a pad unit formed on the second planar area 2A or, alternatively, may be directly formed on the second planar area 2A.

The power supply unit may perform a function of supplying various power sources needed to drive the display device. For instance, the power supply unit may supply the first power source ELVDD, the second power source ELVSS, and the initialization power source Vint to the pixels PXL. Furthermore, the power supply unit may supply a driving power source for driving the scan driver 210, the emission driver 220, etc. In addition, the power supply unit may supply a ground voltage to a conductive layer provided to form the substrate 1.

The display area DA and the peripheral area NDA may include at least one emission element, data lines (or data fan-out lines) for providing data signals to respective pixels of a pixel area, scan lines for providing scan signals, emission lines for providing emission signals, and a power supply line for providing a power voltage, the pad unit, and so forth.

In this specification, for the sake of explanation, an organic light-emitting diode will be described as a kind of emission element by way of example, but the present disclosure is not limited thereto. For example, the emission element may include a liquid crystal display element.

Figure 4:
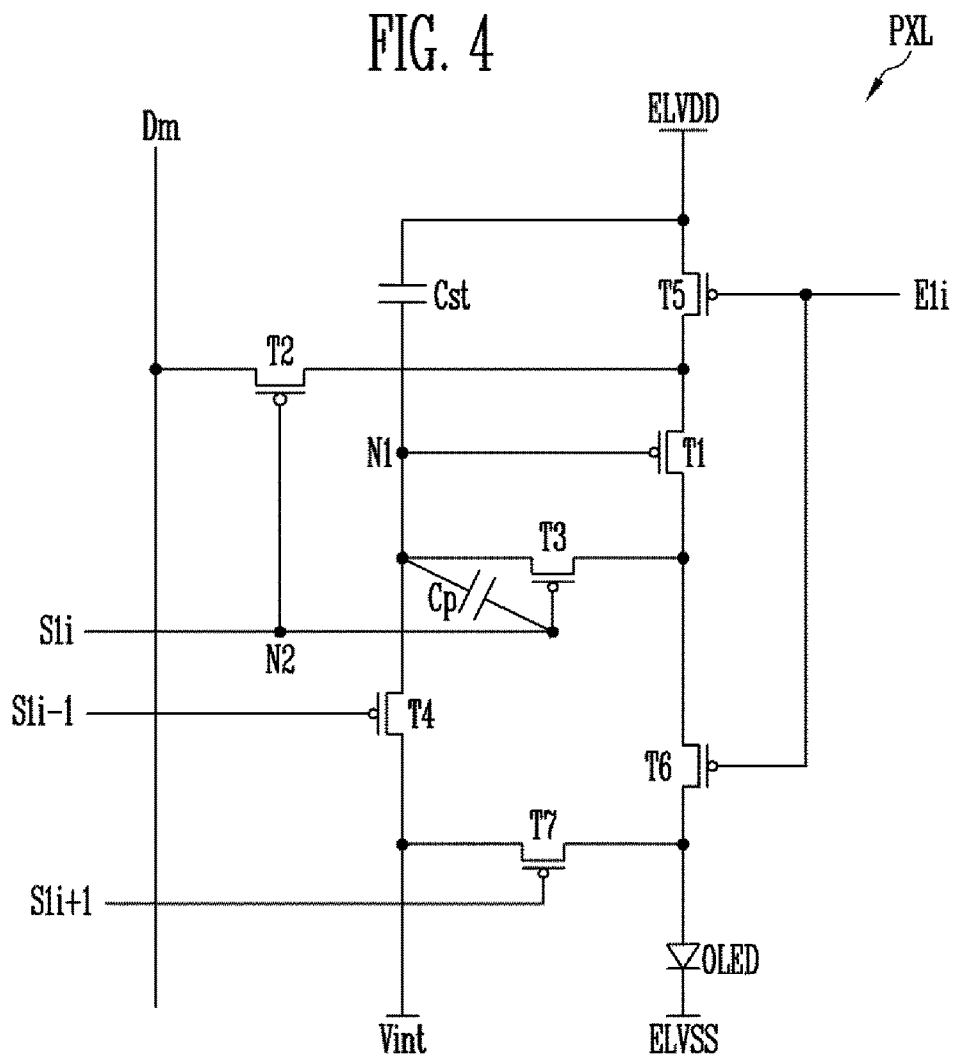
FIG. 4 is a diagram illustrating an example of a pixel shown in FIG. 1.

FIG. 4 is a diagram illustrating an example of the pixel PXL shown in FIG. 1. In FIG. 4, for the sake of description, a pixel PXL coupled to an m-th data line Dm and an i-th scan line S1$i$ will be illustrated.

Referring to FIG. 4, the pixel PXL in accordance with an embodiment of the present disclosure may include an organic light-emitting diode OLED, first to seventh transistors T1 to T7, and a storage capacitor Cst.

An anode of the OLED may be coupled to the first transistor T1 via the sixth transistor T6, and a cathode thereof may be coupled to a second pixel power source ELVSS. The organic light-emitting diode OLED may generate light having a luminance (e.g., a predetermined luminance) corresponding to current supplied from the first transistor T1.

A first pixel power source ELVDD may be set to a voltage higher than that of the second pixel power source ELVSS such that current can flow to the organic light-emitting diode OLED.

The seventh transistor T7 may be coupled between an initialization power source Vint and the anode of the organic light-emitting diode OLED. A gate electrode of the seventh transistor T7 may be coupled to an i+1-th scan line S1$i$+1. When a scan signal is supplied to the i+1-th scan line S1$i$+1, the seventh transistor T7 may be turned on such that a voltage of the initialization power source Vint may be supplied to the anode of the organic light-emitting diode OLED. The initialization power source Vint may be set to a voltage lower than that of the data signal.

In FIG. 4, there has been illustrated an example in which the i+1-th scan line S1$i$+1 is coupled to the gate electrode of the seventh transistor T7, but the present disclosure is not limited thereto. For example, the gate electrode of the seventh transistor T7 may be coupled to an i-th scan line S1$i$ or an i−1-th scan line S1M.

The sixth transistor T6 may be coupled between the first transistor T1 and the organic light-emitting diode OLED. A gate electrode of the sixth transistor T6 may be coupled to an i-th emission control line E1$i$. The sixth transistor T6 may be turned off when an emission control signal is supplied to the i-th emission control line E1$i$, and may be turned on in other cases.

The fifth transistor T5 may be coupled between the first pixel power source ELVDD and the first transistor T1. A gate electrode of the fifth transistor T5 may be coupled to the i-th emission control line E1$i$. The fifth transistor T5 may be turned off when an emission control signal is supplied to the i-th emission control line E1$i$, and may be turned on in other cases.

A first electrode of the first transistor T1 (driving transistor) may be coupled to the first pixel power source ELVDD via the fifth transistor T5, and a second electrode thereof may be coupled to the anode of the organic light-emitting diode OLED via the sixth transistor T6. A gate electrode of the first transistor T1 may be coupled to a first node N1. The first transistor T1 may control, in response to a voltage of the first node N1, current flowing from the first pixel power source ELVDD to the second pixel power source ELVSS via the organic light-emitting diode OLED.

The third transistor T3 may be coupled between a second electrode of the first transistor T1 and the first node N1. A gate electrode of the third transistor T3 may be coupled to the i-th scan line S1$i$. When a scan signal is supplied to the i-th scan line S1$i$, the third transistor T3 may be turned on such that the second electrode of the first transistor T1 can be electrically coupled with the first node N1. Therefore, when the third transistor T3 is turned on, the first transistor T1 may be connected in the form of a diode.

The fourth transistor T4 may be coupled between the first node N1 and the initialization power source Vint. A gate electrode of the fourth transistor T4 may be coupled to the i−1-th scan line S1$i$−1. When a scan signal is supplied to the i−1-th scan line S1$i$−1, the fourth transistor T4 is turned on such that the voltage of the initialization power source Vint can be supplied to the first node N1.

In the case in which the pixel PXL shown in FIG. 4 is disposed on a first horizontal line of a first pixel area, the gate electrode of the fourth transistor T4 may be coupled to a dummy line (not shown) corresponding to the i−1-th scan line S1$i$−1.

The second transistor T2 may be coupled between the m-th data line Dm and the first electrode of the first transistor T1. A gate electrode of the second transistor T2 may be coupled to the i-th scan line S1$i$. When a scan signal is supplied to the i-th scan line S1$i$, the second transistor T2 may be turned on such that the first electrode of the first transistor T1 can be electrically coupled with the m-th data line Dm.

The storage capacitor Cst may be coupled between the first pixel power source ELVDD and the first node N1. The storage capacitor Cst may store a voltage corresponding both to a data signal and to a threshold voltage of the first transistor T1.

The pixel structure illustrated in FIG. 4 is only one example using the three scan lines and the emission control line, and the pixel PXL according to the present disclosure is not limited to the foregoing pixel structure.

In the present disclosure, the organic light-emitting diode OLED may generate light having any of various colors including red, green, and blue in response to current supplied from the driving transistor, but the present disclosure is not limited thereto. For instance, the organic light-emitting diode OLED may generate white light depending on the current supplied from the driving transistor. In this case, a separate color filter or the like may be used to embody a color image.

Figure 5:
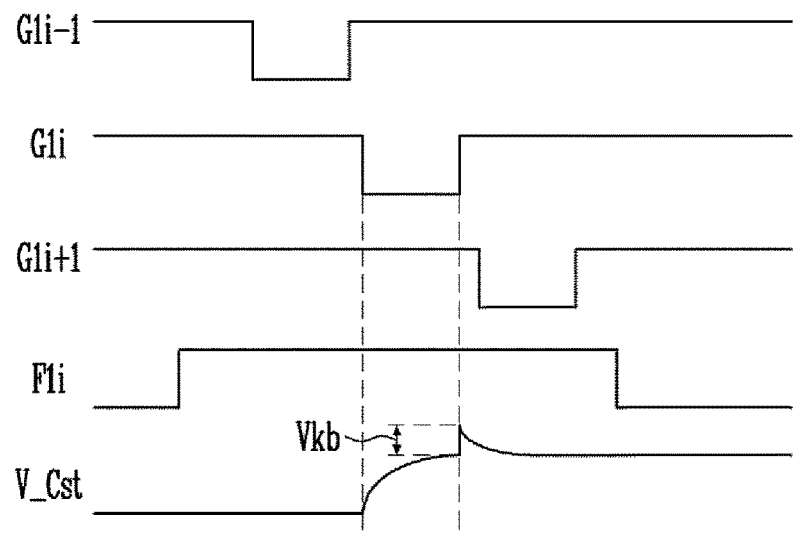
FIG. 5 is a diagram illustrating a method of driving the pixel shown in FIG. 4.

FIG. 5 is a diagram illustrating a method of driving the pixel PXL shown in FIG. 4.

First, an emission control signal F1$i$ is supplied to the i-th emission control line E1$i$. When the emission control signal F1$i$ is supplied to the i-th emission control line E1$i$, the fifth transistor T5 and the sixth transistor T6 are turned off. Here, the pixel PXL may be set to a non-emission state.

Subsequently, a scan signal G1$i$−1 is supplied to the i−1-th scan line S1$i$−1, so that the fourth transistor T4 is turned on. When the fourth transistor T4 is turned on, the voltage of the initialization power source Vint is supplied to the first node N1. Then, the first node N1 may be initialized to the voltage of the initialization power source Vint.

After the first node N1 has been initialized to the voltage of the initialization power source Vint, a scan signal G1$i$ is supplied to the i-th scan line S1$i$. When the scan signal G1$i$ is supplied to the i-th scan line S1$i$, the second transistor T2 and the third transistor T3 are turned on.

When the third transistor T3 is turned on, the first transistor T1 is connected in the form of a diode.

When the second transistor T2 is turned on, a data signal is supplied from the m-th data line Dm to the first electrode of the first transistor T1. Here, since the first node N1 has been initialized to the voltage of the initialization power source Vint that is lower than the data signal, the first transistor T1 may be turned on.

When the first transistor T1 is turned on, a voltage formed by subtracting the threshold voltage of the first transistor T1 from the data signal is applied to the first node N1. The storage capacitor Cst stores a voltage V_Cst corresponding both to the data signal applied to the first node N1 and to the threshold voltage of the first transistor T1.

Thereafter, a scan signal G1$i$+1 is supplied to the i+1-th scan line S1$i$+1. When the scan signal G1$i$+1 is supplied to the i+1-th scan line S1$i$+1, the seventh transistor T7 is turned on.

When the seventh transistor T7 is turned on, the voltage of the initialization power source Vint is supplied to the anode electrode of the organic light-emitting diode OLED. Then, a parasitic capacitor which is parasitically formed in the organic light-emitting diode OLED is discharged, whereby the black expression performance may be enhanced.

Thereafter, the supply of the emission control signal E1$i$ to the i-th emission control line E1$i$ is interrupted.

When the supply of the emission control signal E1$i$ to the i-th emission control line E1$i$ is interrupted, the fifth transistor T5 and the sixth transistor T6 are turned on. Then, there is formed a current path extending from the first power source ELVDD to the second power source ELVSS via the fifth transistor T5, the first transistor T1, the sixth transistor T6, and the organic light-emitting diode OLED.

Here, the first transistor T1 may control, in response to the voltage of the first node N1, current flowing from the first power source ELVDD to the second power source ELVSS via the organic light-emitting diode OLED. The organic light-emitting diode OLED may emit light having a luminance (e.g., a predetermined luminance) corresponding to the current supplied from the first transistor T1.

Substantially, the pixel PXL may repeatedly perform the above-mentioned process and thus generate light having a luminance (e.g., a predetermined luminance).

The emission control signal F1$i$ to be supplied to the i-th emission control line E1$i$ may overlap at least one scan signal such that the pixel PXL is set to a non-emission state during a period for which the data signal is charged to the pixel PXL. Such a supply timing of the emission control signal F1i may be changed in various forms.

A parasitic capacitance Cp may be formed between the gate electrode and the first electrode (e.g., the source electrode) of the third transistor T3. The parasitic capacitance Cp may affect a kick back voltage Vkb. The higher the parasitic capacitance Cp, the higher the level of the kick back voltage Vkb may be.

When the voltage of the i-th scan signal G1i is changed from a low level to a high level, the voltage of the second node N2 may be increased. The amount of change in voltage of the storage capacitor Cst due to an increase in voltage of the second node N2 may be referred to as the kick back voltage Vkb. The higher the level of kick back voltage Vkb, the higher the possibility of deterioration in luminance of an image may be.

As described with reference to FIGS. 2 and 3, the substrate 1 may include material having flexible or bendable characteristics. In an embodiment, polyimide may be mainly used to manufacture the substrate having the flexible or bendable characteristics.

Due to the characteristics of polyimide, negative charges may be easily trapped. If a negative charge is trapped in the substrate, the threshold voltages of the transistors may be shifted in a positive direction. Particularly, if the threshold voltage of the third transistor is shifted in the positive direction, the parasitic capacitance Cp is increased. The increase of the parasitic capacitance Cp may increase the kick back voltage Vkb.

Therefore, in the case in which the pixel unit is formed on the substrate including polyimide, a problem of deterioration in luminance of an image may be caused. Hence, if the pixel unit is formed on the substrate including polyimide, there is a need to prevent or substantially prevent a negative charge from being trapped in the substrate.

Herein, a structure of the substrate in accordance with an embodiment of the present disclosure will be described in further detail.

Figure 6:
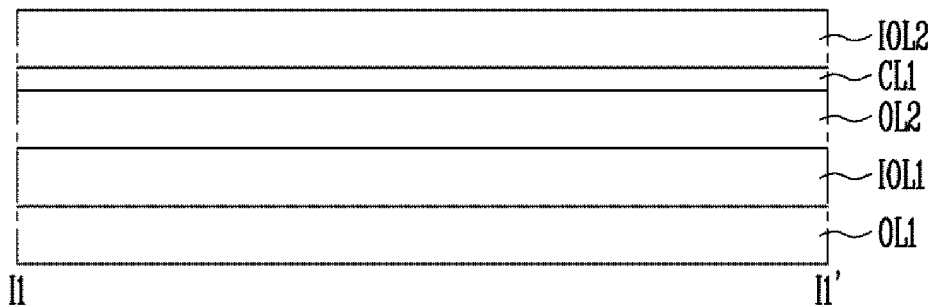
FIG. 6 is a cross-sectional view taken along the line I1-I1' of FIG. 3 in accordance with an embodiment.

FIG. 6 is a cross-sectional view taken along the line I1-I1' of FIG. 3 in accordance with an embodiment.

Referring to FIG. 6, the substrate 1 in accordance with an embodiment of the present disclosure may include a plurality of inorganic layers IOL1 and IOL2, a plurality of organic layers OL1 and OL2, and a first conductive layer CL1.

In an embodiment, the first organic layer OL1 may be made of a polymer, and may have a single layer or multilayer structure including polyimide. Furthermore, the first organic layer OL1 may include one or more of polyethylene terephthalate, polycarbonate, epoxy, polyethylene, and polyacrylate.

The first inorganic layer IOL1 may be formed over the first organic layer OL1.

The first inorganic layer IOL1 may have a single layer or multilayer structure including metal oxide or metal nitride. In an embodiment, the first inorganic layer IOL1 may include one or more of silicon nitride (SiNx), aluminum oxide ($Al_2O_3$), silicon oxide (SiOx), and titanium oxide ($TiO_2$).

The second organic layer OL2 may be formed over the first inorganic layer IOL1. In an embodiment, the second organic layer OL2 may include material capable of forming the first organic layer OL1, and may be formed of the same material as that of the first organic layer OL1. The second organic layer OL2 may have a single layer or multilayer structure.

The first conductive layer CL1 may be formed over the second organic layer OL2, and may have a single layer or multilayer structure.

The first conductive layer CL1 may include a conductive material. In an embodiment of the present disclosure, the conductive material may include a metal or an alloy of a metal. Examples of the metal may include gold (Au), silver (Ag), aluminum (Al), molybdenum (Mo), chromium (Cr), titanium (Ti), nickel (Ni), neodymium (Nd), copper (Cu), and platinum (Pt).

In an embodiment, the first conductive layer CL1 may be formed of a transparent conductive material. Examples of the transparent conductive material may include a silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), a carbon nanotube, and graphene.

In an embodiment, the first conductive layer CL1 may include PEDOT:PSS.

Figure 7:
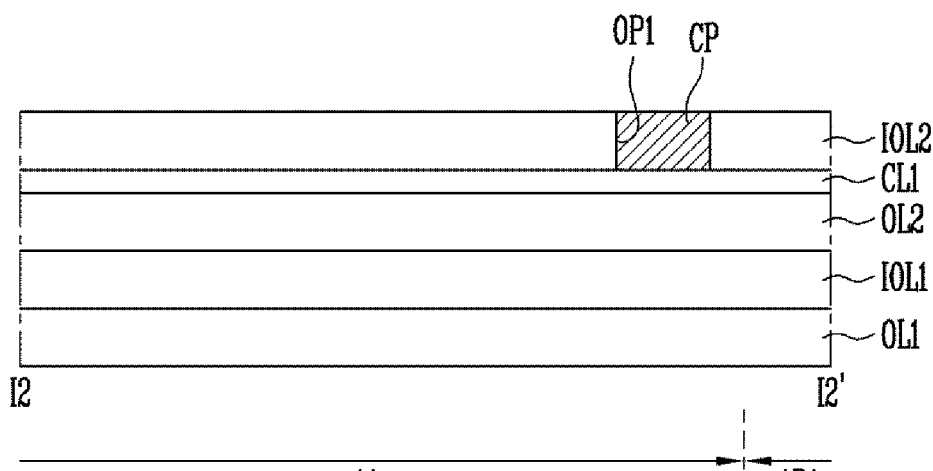
FIG. 7 is a cross-sectional view taken along the line I2-I2' of FIG. 3 in accordance with an embodiment.

FIG. 7 is a cross-sectional view taken along the line I2-I2' of FIG. 3 in accordance with an embodiment.

Referring to FIG. 7, the second inorganic layer IOL2 may include a connection pattern CP. The connection pattern CP may be formed by filling an opening OP1 formed in the second inorganic layer IOL2 with a conductive material. In other words, a portion of an upper surface of the first conductive layer CL1 may come into direct contact with the connection pattern CP.

In an embodiment, the connection pattern CP may have the form of a trench extending in the first direction DR1. Alternatively, the connection pattern CP may have a hole shape. In this case, a plurality of connection patterns CP may be arranged in the first direction DR1.

The connection pattern CP may be coupled to a power supply unit disposed on the substrate 1 so that a ground voltage may be applied to the connection pattern CP. Therefore, the first conductive layer CL1 may be supplied with the ground voltage through the connection pattern CP, thereby preventing or substantially preventing a negative charge from being trapped in the first or second organic layer OL1 or OL2 including polyimide.

The conductive material included in the connection pattern CP may include at least any one of materials capable of forming the first conductive layer CL1.

The opening OP1 may be formed in the first planar area 1A and disposed adjacent to the first bending area 1BA.

Since the hardness of an inorganic layer is generally relatively high, there is a high probability of occurrence of a crack or the like in the inorganic layer when stress is applied to the inorganic layer. If a crack is formed in the inorganic layer, there is also a high probability of occurrence of a crack in components (e.g., thin-film transistors or lines) disposed on the inorganic layer.

However, in the present disclosure, the opening OP1 may be formed in the second inorganic layer IOL2 at a position adjacent to the first bending area 1BA, whereby a crack may be prevented or substantially prevented from being formed in the second inorganic layer IOL2 when the substrate 1 is bent.

Figure 8:
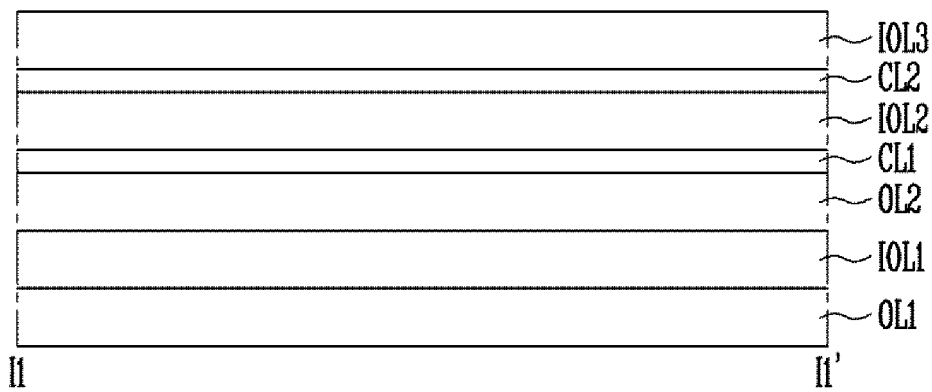
FIG. 8 is a cross-sectional view taken along the line I1-I1' of FIG. 3 in accordance with an embodiment.
Figure 9:
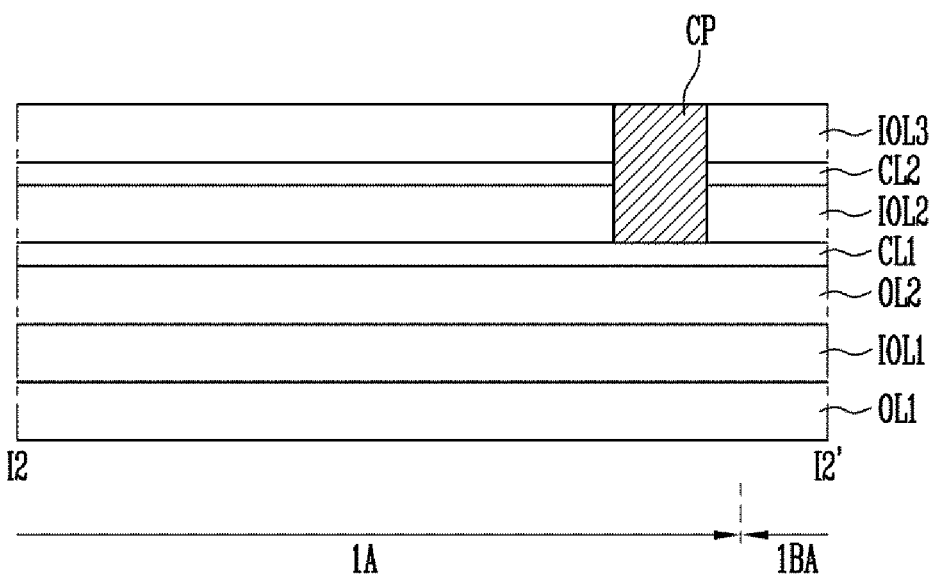
FIG. 9 is a cross-sectional view taken along the line I2-I2' of FIG. 3 in accordance with an embodiment.

FIG. 8 is a cross-sectional view taken along the line I1-I1' of FIG. 3 in accordance with an embodiment; and FIG. 9 is a cross-sectional view taken along the line I2-I2' of FIG. 3 in accordance with an embodiment.

The following description with reference with FIGS. 8 and 9 will be focused on differences from the above-described embodiments, and some redundant descriptions may be omitted. Hence, the following description will be focused on a second conductive layer CL2 and a third inorganic layer IOL3.

Referring to FIGS. 8 and 9, the substrate 1 may include a plurality of inorganic layers IOL1, IOL2, and IOL3, a plurality of organic layers OL1 and OL2, and a plurality of conductive layers CL1 and CL2.

In an embodiment, the first organic layer OL1, the first inorganic layer IOL1, the second organic layer OL2, the first conductive layer CL1, the second inorganic layer IOL2, the second conductive layer CL2, and the third inorganic layer IOL3 may form a successively stacked structure.

Here, the second conductive layer CL2 may include a conductive material. In an embodiment, the conductive material may include at least any one of materials capable of forming the first conductive layer CL1. In an embodiment, the second conductive layer CL2 may be formed of the same material as that of the first conductive layer CL1.

The third inorganic layer IOL3 may be formed of a single layer or multilayer structure including an inorganic material, such as silicon oxide, silicon nitride, and/or silicon oxynitride.

The substrate 1 may include a connection pattern CP. The connection pattern CP may pass through the second inorganic layer IOL2, the second conductive layer CL2, and the third inorganic layer IOL3 and come into contact with an upper surface of the first conductive layer CL1. Furthermore, the connection pattern CP may come into contact with a side surface of the second conductive layer CL2.

The connection pattern CP may be coupled to a power supply unit provided on the substrate 1 so that a ground voltage may be applied to the connection pattern CP.

Therefore, the first conductive layer CL1 and the second conductive layer CL2 that come into contact with the connection pattern CP may be supplied with the ground voltage through the connection pattern CP. Negative charges accumulated in the organic layers OL1 and OL2 including polyimide, for example, may be discharged through the first conductive layer CL1 and the second conductive layer CL2.

Figure 10:
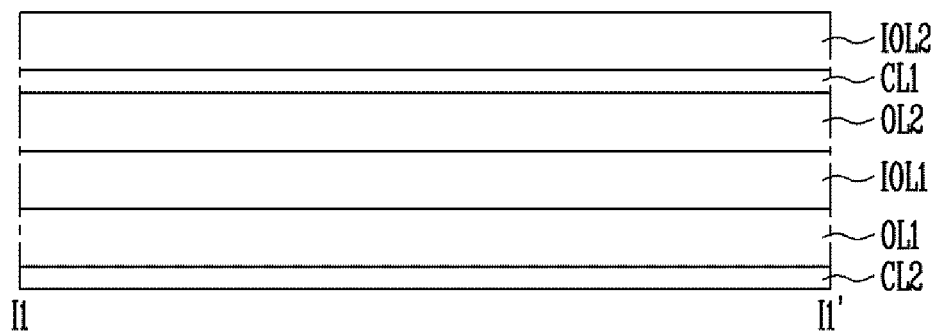
FIG. 10 is a cross-sectional view taken along the line I1-I1' of FIG. 3 in accordance with an embodiment.
Figure 10:
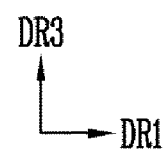
Figure 11:
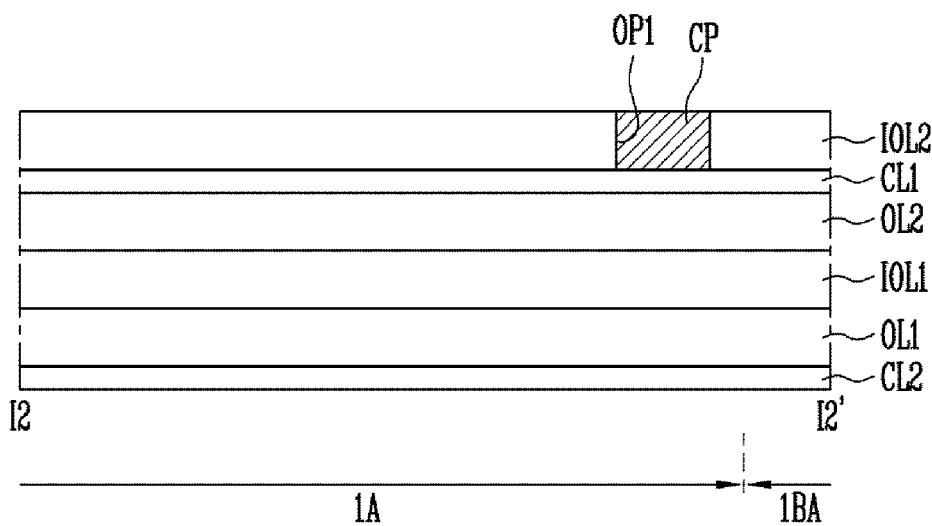
FIG. 11 is a cross-sectional view taken along the line I2-I2' of FIG. 3 in accordance with an embodiment.
Figure 11:
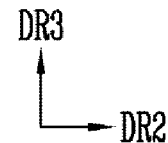

FIG. 10 is a cross-sectional view taken along the line I1-I1' of FIG. 3 in accordance with an embodiment; and FIG. 11 is a cross-sectional view taken along the line I2-I2' of FIG. 3 in accordance with an embodiment.

The following description with reference with FIGS. 10 and 11 will be focused on differences from the above-described embodiments, and some redundant descriptions may be omitted. Hence, the following description will be focused on a second conductive layer CL2.

Referring to FIGS. 10 and 11, the substrate 1 may include a plurality of inorganic layers IOL1 and IOL2, a plurality of organic layers OL1 and OL2, and a plurality of conductive layers CL1 and CL2.

In an embodiment, the second conductive layer CL2, the first organic layer OL1, the first inorganic layer IOL1, the second organic layer OL2, the first conductive layer CL1, and the second inorganic layer IOL2 may form a successively stacked structure.

Here, the second conductive layer CL2 may include a conductive material. In an embodiment, the conductive material may include at least any one of materials capable of forming the first conductive layer CL1. In an embodiment, the second conductive layer CL2 may be formed of the same material as that of the first conductive layer CL1.

Although not shown in FIGS. 10 and 11, in an embodiment, the substrate 1 may further include a conductive layer and an inorganic layer which are formed on the second inorganic layer IOL2.

Figure 12A:
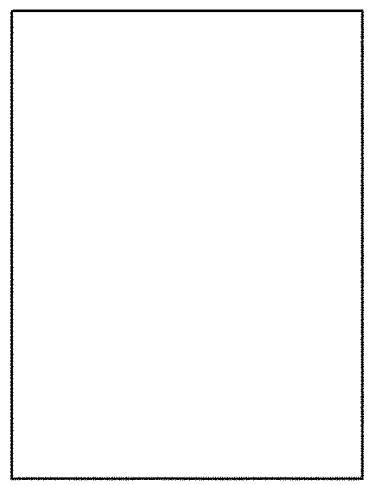
FIGS. 12A to 12C are diagrams illustrating some examples of a shape of a conductive layer in accordance with an embodiment of the present disclosure.
Figure 12B:
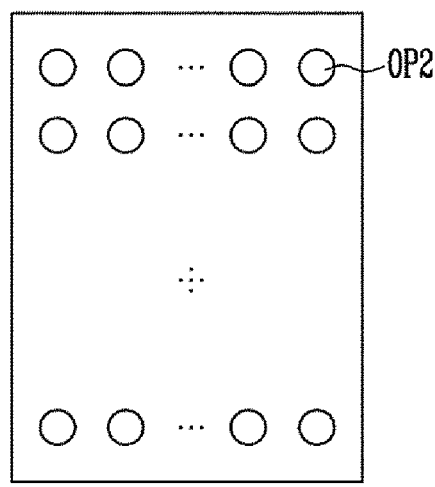
Figure 12C:
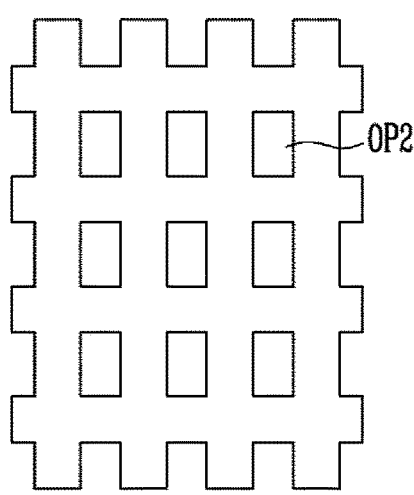

FIGS. 12A to 12C are diagrams illustrating some examples of a shape of the conductive layer CL1 in accordance with an embodiment of the present disclosure.

Particularly, FIGS. 12A to 12C illustrate some examples of the shape of the first conductive layer in a plan view defined by the first direction DR1 and the second direction DR2.

Referring to FIG. 12A, the first conductive layer CL1 may have a rectangular shape and may be formed to cover the entirety of an upper surface of the second organic layer OL1.

As shown in FIGS. 12B and 12C, the first conductive layer CL1 may include at least one or more openings OP2. In the case in which the openings OP2 are formed in the first conductive layer CL1, the reflectivity of externally input light on the first conductive layer CL1 may be reduced.

In the case in which the openings OP2 are formed in the first conductive layer CL1, the third transistor T3 shown in FIG. 4 among thin-film transistors to be formed on the substrate 1 when the display device is manufactured may not overlap with the openings OP2.

As described above, if charges are trapped in the substrate 1, the parasitic capacitance between the gate electrode and the source electrode of the third transistor T3 may increase, thus causing a problem of deterioration in luminance of an image.

The first conductive layer CL1 functions to prevent or substantially prevent the threshold voltages of the transistors from increasing due to charges trapped in the first and second organic layers OL1 and OL2. Given this, the first conductive layer CL1 may overlap with the third transistor T3, thus minimizing or reducing an influence of the charges trapped in the first and second organic layers OL1 and OL2 on the third transistor T3.

Although the shape of the second conductive layer CL2 is not separately shown, it may have the same shape as that shown in any one of FIGS. 12A to 12C. Furthermore, in an embodiment, the second conductive layer CL2 may have the same shape as that of the first conductive layer CL1.

In various embodiments of the present disclosure, charges may be prevented or substantially prevented from being trapped in a substrate.

Furthermore, various embodiments of the present disclosure may provide a display device capable of displaying a high-quality image by avoiding deterioration in luminance of an image due to charges trapped in the substrate.

Some example embodiments have been disclosed herein, and although specific terms are employed, they are used and are to be interpreted in a generic and descriptive sense and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A flexible organic light-emitting display device comprising:
   a first polymer layer;
   a first transparent conductive layer over the first polymer layer;
   a first inorganic layer over the first transparent conductive layer;

a plurality of pixels on the first inorganic layer, and each including an organic light-emitting diode, and a driver configured to drive the organic light-emitting diode; and a conductive connection pattern contacting the first transparent conductive layer, wherein the first inorganic layer includes a first opening, and wherein the conductive connection pattern is in the first opening, the flexible organic light-emitting display device further comprising:

a first planar area in which the plurality of pixels is arranged;

a first bending area on a side of the first planar area and configured to be bendable about a first bending axis extending in a first direction; and a second planar area on a side of the first bending area, and wherein the first opening and the conductive connection pattern therein are in the first planar area.

2. The flexible organic light-emitting display device according to claim 1, further comprising:
a second polymer layer; and
a second inorganic layer between the second polymer layer and the first polymer layer.

3. The flexible organic light-emitting display device according to claim 2, further comprising a second transparent conductive layer under the second polymer layer.

4. The flexible organic light-emitting display device according to claim 1, further comprising a buffer layer over the first inorganic layer.

5. The flexible organic light-emitting display device according to claim 1, wherein the conductive connection pattern is electrically coupled with a power supply unit provided in the second planar area.

6. The flexible organic light-emitting display device according to claim 5, wherein the first transparent conductive layer is supplied with a ground voltage through the conductive connection pattern.

7. The flexible organic light-emitting display device according to claim 6, further comprising:
a second transparent conductive layer over the first inorganic layer; and
a third inorganic layer over the second transparent conductive layer.

8. The flexible organic light-emitting display device according to claim 1, wherein the first transparent conductive layer includes at least one second opening.

9. A flexible organic light-emitting display device comprising:
a first polymer layer;
a first transparent conductive layer over the first polymer layer;
a first inorganic layer over the first transparent conductive layer, wherein the first inorganic layer includes a first opening;
a plurality of pixels on the first inorganic layer, and each including an organic light-emitting diode, and a driver configured to drive the organic light-emitting diode; and
a conductive connection pattern in the first opening and contacting the first transparent conductive layer, wherein the driver included in each of the plurality of pixels comprises a plurality of thin-film transistors and a storage capacitor, and the thin-film transistors comprise:

a first transistor including a gate electrode, a first electrode, and a second electrode, and configured to control current to be supplied from a first power source coupled with the first electrode to a second power source via the organic light-emitting diode, in response to a voltage of a first node coupled to the gate electrode;

a second transistor coupled between a data line and the first transistor, and including a gate electrode coupled to a scan line; and a third transistor including a first electrode coupled to the first node, a second electrode coupled to the second electrode of the first transistor, and a gate electrode coupled to the scan line, and wherein the flexible organic light-emitting display device further comprises:

a first planar area in which the plurality of pixels is arranged;

a first bending area on a side of the first planar area and configured to be bendable about a first bending axis extending in a first direction; and a second planar area on a side of the first bending area, and the first opening and the conductive connection pattern therein are in the first planar area.

10. The flexible organic light-emitting display device according to claim 9, wherein the third transistor and the first transparent conductive layer overlap with each other in a plan view.

11. A flexible substrate comprising:
a first polymer layer;
a first inorganic layer over the first polymer layer;
a second polymer layer over the first inorganic layer;
a first transparent conductive layer over the second polymer layer; and
a second inorganic layer over the first transparent conductive layer, wherein the flexible substrate comprises:
a first planar area;
a first bending area on a side of the first planar area and configured to be bendable about a first bending axis extending in a first direction; and
a second planar area on a side of the first bending area, wherein the second inorganic layer includes a first opening, the flexible substrate further comprising a conductive connection pattern in the first opening and contacting the first transparent conductive layer, and wherein the first opening and the conductive connection pattern therein are in the first planar area.

12. The flexible substrate according to claim 11, further comprising:
a second transparent conductive layer over the second inorganic layer; and
a third inorganic layer over the second transparent conductive layer.

13. The flexible substrate according to claim 12, wherein the conductive connection pattern passes through the second transparent conductive layer and the third inorganic layer.

14. The flexible substrate according to claim 11, further comprising a second transparent conductive layer under the first polymer layer.

15. The flexible substrate according to claim 11, wherein the first transparent conductive layer includes at least one second opening.

16. The flexible substrate according to claim 11, wherein each of the first polymer layer and the second polymer layer includes polyimide.

\* \* \* \* \*